(12) United States Patent
Steffler

(10) Patent No.: US 7,952,329 B2
(45) Date of Patent: May 31, 2011

(54) METHODS AND SYSTEM FOR BACKUP POWER SUPPLY

(75) Inventor: Joseph B. Steffler, Alto, MI (US)

(73) Assignee: General Electric Company, Schenectady, NY (US)

( * ) Notice: Subject to any disclaimer, the term of this patent is extended or adjusted under 35 U.S.C. 154(b) by 177 days.

(21) Appl. No.: 12/260,260

(22) Filed: Oct. 29, 2008

(65) Prior Publication Data

US 2010/0103628 A1    Apr. 29, 2010

(51) Int. Cl.
*H02J 7/00* (2006.01)
(52) U.S. Cl. ............ 320/128; 361/730; 307/66; 320/107
(58) Field of Classification Search .................. None
See application file for complete search history.

(56) References Cited

U.S. PATENT DOCUMENTS

| | | | |
|---|---|---|---|
| 4,255,782 A * | 3/1981 | Joyce ................................. 363/8 |
| 5,864,221 A | 1/1999 | Downs et al. |
| 6,410,995 B1 | 6/2002 | Grouse et al. |
| 6,561,835 B1 | 5/2003 | Hirschberg et al. |
| 6,741,896 B1 | 5/2004 | Olzak et al. |
| 6,816,087 B2 * | 11/2004 | Lane .............................. 340/945 |
| 6,963,293 B1 * | 11/2005 | Rast .............................. 340/981 |
| 6,995,658 B2 | 2/2006 | Tustison et al. |
| 7,131,136 B2 * | 10/2006 | Monroe ........................ 725/105 |
| 7,218,537 B2 | 5/2007 | Sherwood et al. |
| 2007/0085420 A1 | 4/2007 | Hartung et al. |
| 2008/0036298 A1 | 2/2008 | Ausman et al. |

FOREIGN PATENT DOCUMENTS

EP    1164824 A1    3/2001

OTHER PUBLICATIONS

International Search Report, dated Nov. 23, 2009, from the International Searching Authority for co-pending International Application No. PCT/US2009/055891 (3 pages).

* cited by examiner

*Primary Examiner* — Edward Tso
*Assistant Examiner* — Ramy Ramadan
(74) *Attorney, Agent, or Firm* — William Scott Andes, Esq.; Armstrong Teasdale LLP

(57) ABSTRACT

A system and methods for an avionics system are provided. The avionics system includes an enclosure, a recording device positioned within the enclosure, and an energy storage device positioned within the enclosure wherein the energy storage device electrically coupled to the recording device to supply electrical power to the recording device for a time period of greater than thirty seconds.

19 Claims, 4 Drawing Sheets

METHODS AND SYSTEM FOR BACKUP POWER SUPPLY

BACKGROUND OF THE INVENTION

This invention relates generally to backup power sources and, more particularly, to a system and methods of providing an integrated back up power supply for an avionics unit.

At least some known avionics equipment is powered through an aircraft's electrical bus system such as a 28VDC bus. New Federal Aviation Administration (FAA) rules require that at least some avionics equipment be powered by an independent power source in the event that aircraft power is lost to the avionics equipment. This new requirement may be met by adding a dedicated remote independent power supply LRU and its associated wiring to the aircraft. However, adding another LRU to the aircraft will increase the weight and complexity of the aircraft. Another option is a power supply in the form of a "sled" that would mount in the tray of the current recorder, and the recorder would then be installed on the sled. However, this only eliminates the need to alter aircraft wiring. There is still the addition of a new LRU to the aircraft, as well as a loss of electrical efficiency.

BRIEF DESCRIPTION OF THE INVENTION

In one embodiment, an avionics system includes an enclosure, a recording device positioned within the enclosure, and an energy storage device positioned within the enclosure wherein the energy storage device electrically coupled to the recording device to supply electrical power to the recording device for a time period of greater than thirty seconds In another embodiment, a method of providing an integrated back up power supply for an avionics unit includes providing an enclosure, positioning a voice recorder within the enclosure, and positioning an energy storage device within the enclosure wherein the energy storage device is electrically coupled to the voice recorder and wherein the energy storage device is capable of providing all the electrical power requirements for the operation of the voice recorder for a time period greater than ten minutes.

In yet another embodiment, a method of providing a back up power supply for avionics equipment integrated into a single enclosure of an avionics unit includes disconnecting a first avionics unit from an electrical connector that includes power supply wires to the first avionics unit, removing the first avionics unit from a mounting location, installing a second avionics unit into the mounting location, and electrically coupling the second avionics unit to the electrical connector, the second avionics unit including a back up energy storage device within an interior of the second avionics unit wherein the back up energy storage device is capable of providing all the electrical power requirements for the operation of the second avionics unit for a time period greater than ten minutes.

BRIEF DESCRIPTION OF THE DRAWINGS

FIG. 1 is a perspective view of an avionics unit in accordance with an exemplary embodiment of the present invention;

FIG. 2 is a schematic block diagram of the avionics unit shown in FIG. 1 in accordance with an exemplary embodiment of the present invention;

FIG. 3 is a flow diagram of a method of providing an integrated back up power supply for an avionics unit in accordance with an exemplary embodiment of the present invention; and FIG. 4 is a flow diagram of a method of providing a back up power supply for avionics equipment integrated into a single enclosure of an avionics unit in accordance with an exemplary embodiment of the present invention.

DETAILED DESCRIPTION OF THE INVENTION

The following detailed description illustrates embodiments of the invention by way of example and not by way of limitation. It is contemplated that the invention has general application to supplying backup power to critical equipment in industrial, commercial, and residential applications.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Figure 1:
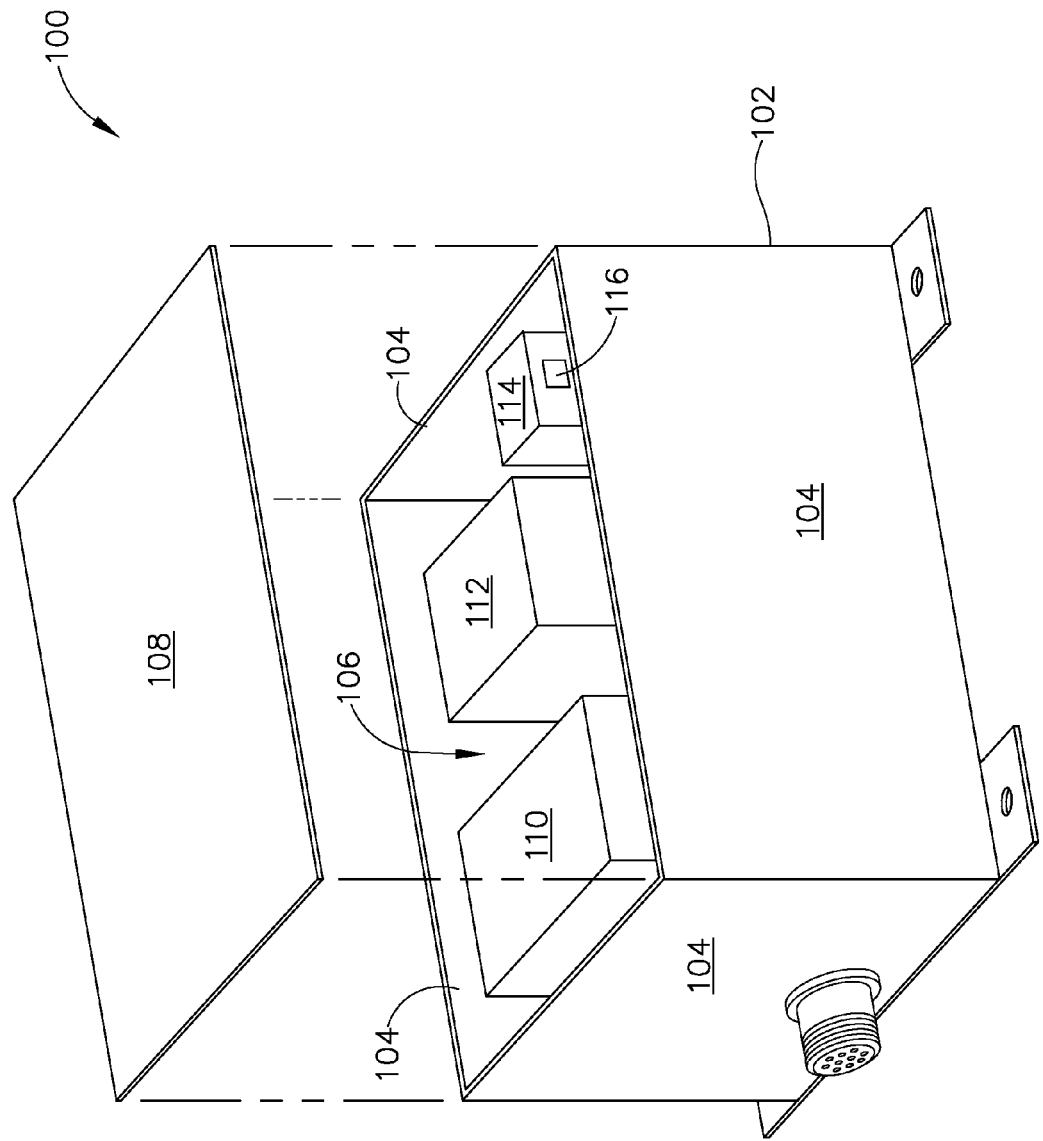
FIGS. 1-4 show exemplary embodiments of the methods and system described herein.

FIG. 1 is a perspective view of an avionics unit 100 in accordance with an exemplary embodiment of the present invention. In the exemplary embodiment, avionics unit 100 includes an enclosure 102 having walls 104 that define an interior space 106 and a cover 108. Avionics unit 100 includes one or more pieces of avionics equipment, such as but not limited to a cockpit voice recorder 110. In the exemplary embodiment, avionics unit 100 also includes an energy storage device 112, and optionally includes a maintenance module 114 configured to maintain energy storage device in a condition of optimal storage capability. In one embodiment energy storage device 112 comprises an electrochemical storage device such as a battery, in which case maintenance module 114 may comprise an intelligent battery charger. Maintenance module 114 may comprise a processor programmed to monitor the operation of energy storage device 112 and to perform controlled battery charging and discharging operations that facilitate maintaining a life of energy storage device at an optimal level. For example, energy storage device is configured to supply the energy requirements of voice recorder 110 during off-normal periods of operation. In one embodiment, energy storage device 112 is capable of supplying all of the energy requirements of voice recorder 110 for greater than ten minutes. In another embodiment, energy storage device 112 is configured to supplying all of the energy requirements of voice recorder 110 for approximately twenty minutes. In the exemplary embodiment, the one or more pieces of avionics equipment, energy storage device 112, and maintenance module 114 are all housed in the same single enclosure 102. The one or more pieces of avionics equipment, energy storage device 112, and maintenance module 114 are electrically and/or communicatively coupled to external equipment, such as but not limited to aircraft instrumentation, electrical supply buses, and communications networks through a connector 118 that extends through a sidewall 104 of enclosure 102 or through cover 108.

Figure 2:
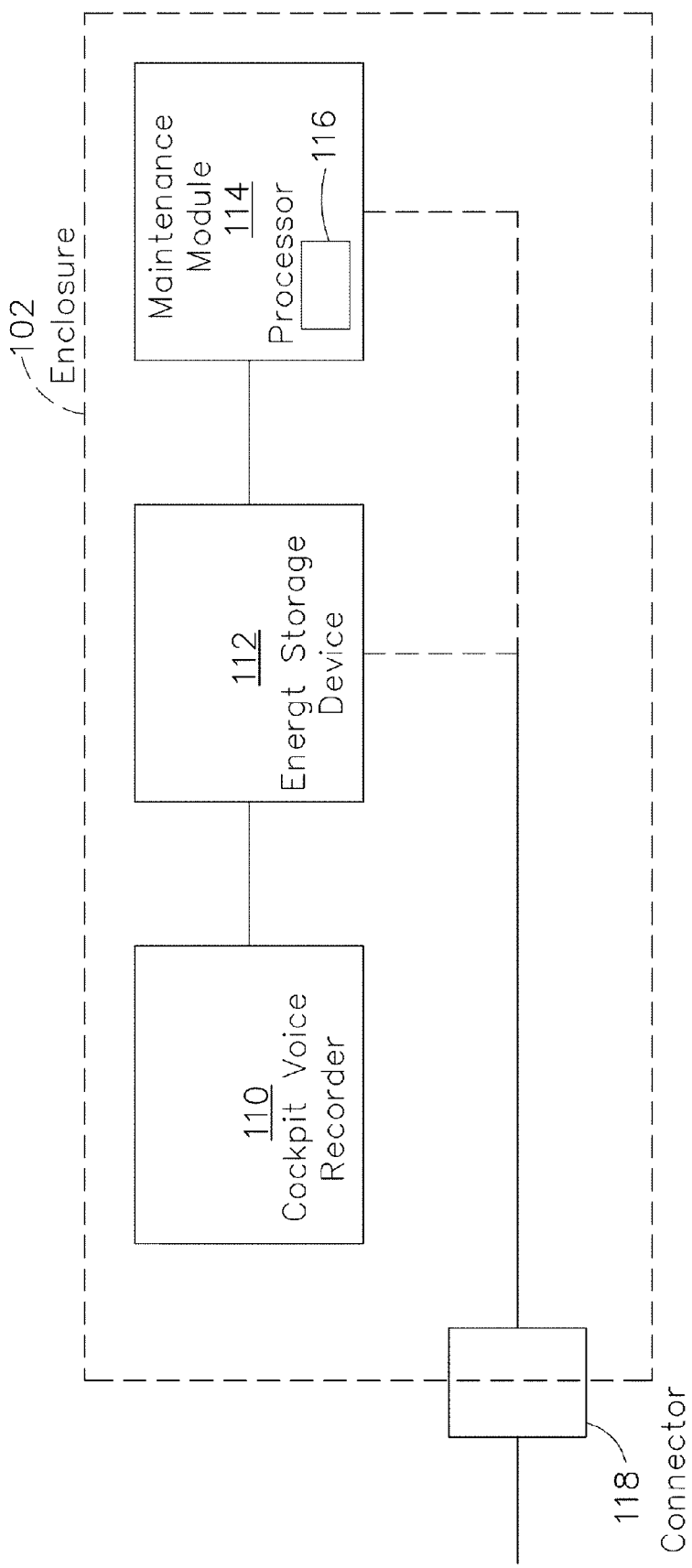

FIG. 2 is a schematic block diagram of avionics unit 100 in accordance with an exemplary embodiment of the present invention. In the exemplary embodiment, avionics unit 100 includes enclosure 102, cockpit voice recorder 110, energy storage device 112, and maintenance module 114. In various embodiments energy storage device 112 comprises a supercapacitor, capacitor having a ceramic dielectric material comprising barium and/or barium titanate. Some selected energy storage devices may require predetermined charging, discharging, and float procedures to maintain the energy storage capability of energy storage device 112 within a predetermined range. Maintenance module 114 is selected to be compatible with and programmed to implement the procedures required for a particularly selected energy storage device.

Figure 3:
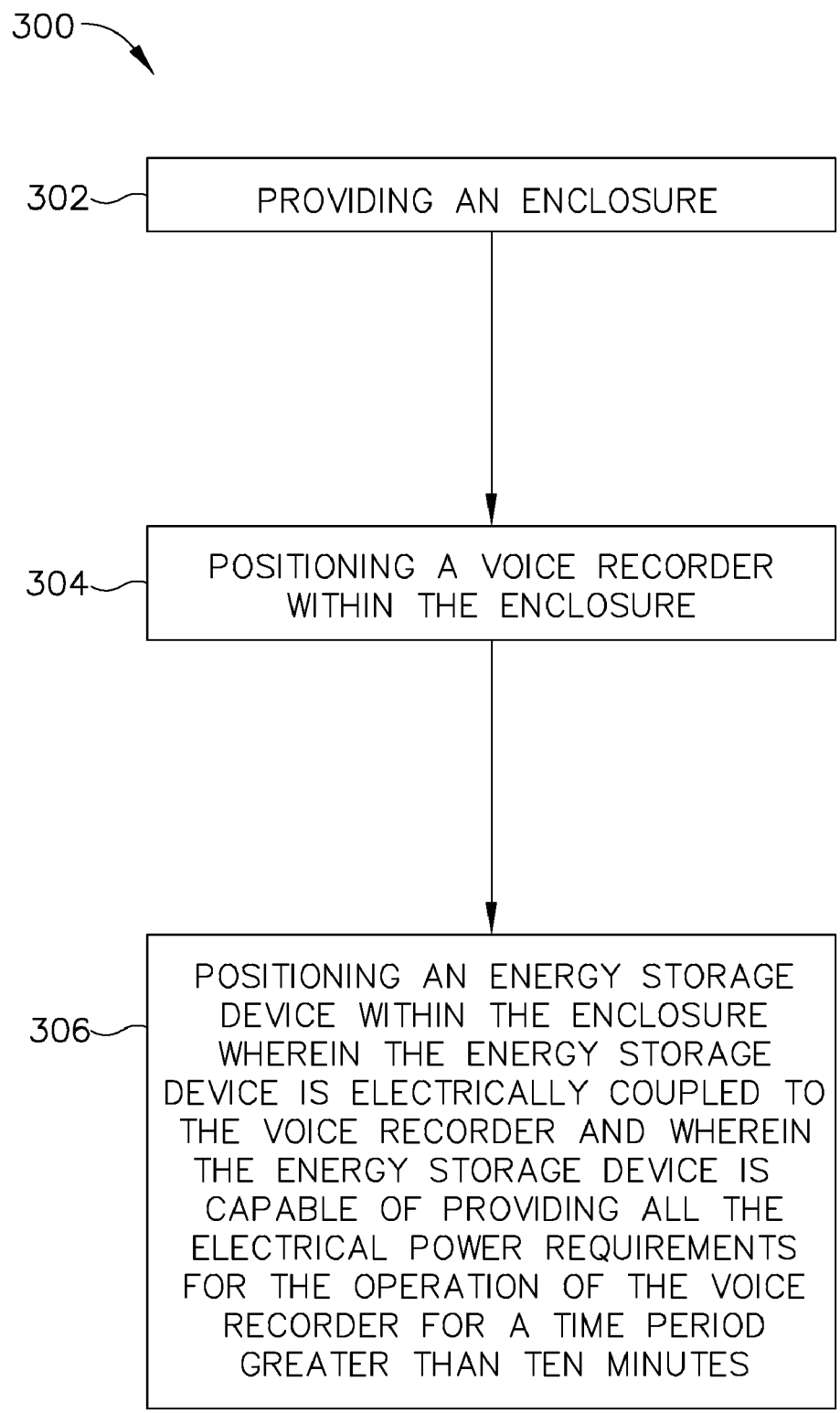

FIG. 3 is a flow diagram of a method 300 of providing an integrated back up power supply for an avionics unit in accordance with an exemplary embodiment of the present invention. Method 300 includes providing 302 an enclosure, positioning 304 a voice recorder within the enclosure, positioning 306 an energy storage device within the enclosure wherein the energy storage device is electrically coupled to the voice recorder and wherein the energy storage device is capable of providing all the electrical power requirements for the operation of the voice recorder for a time period greater than ten minutes.

Figure 4:
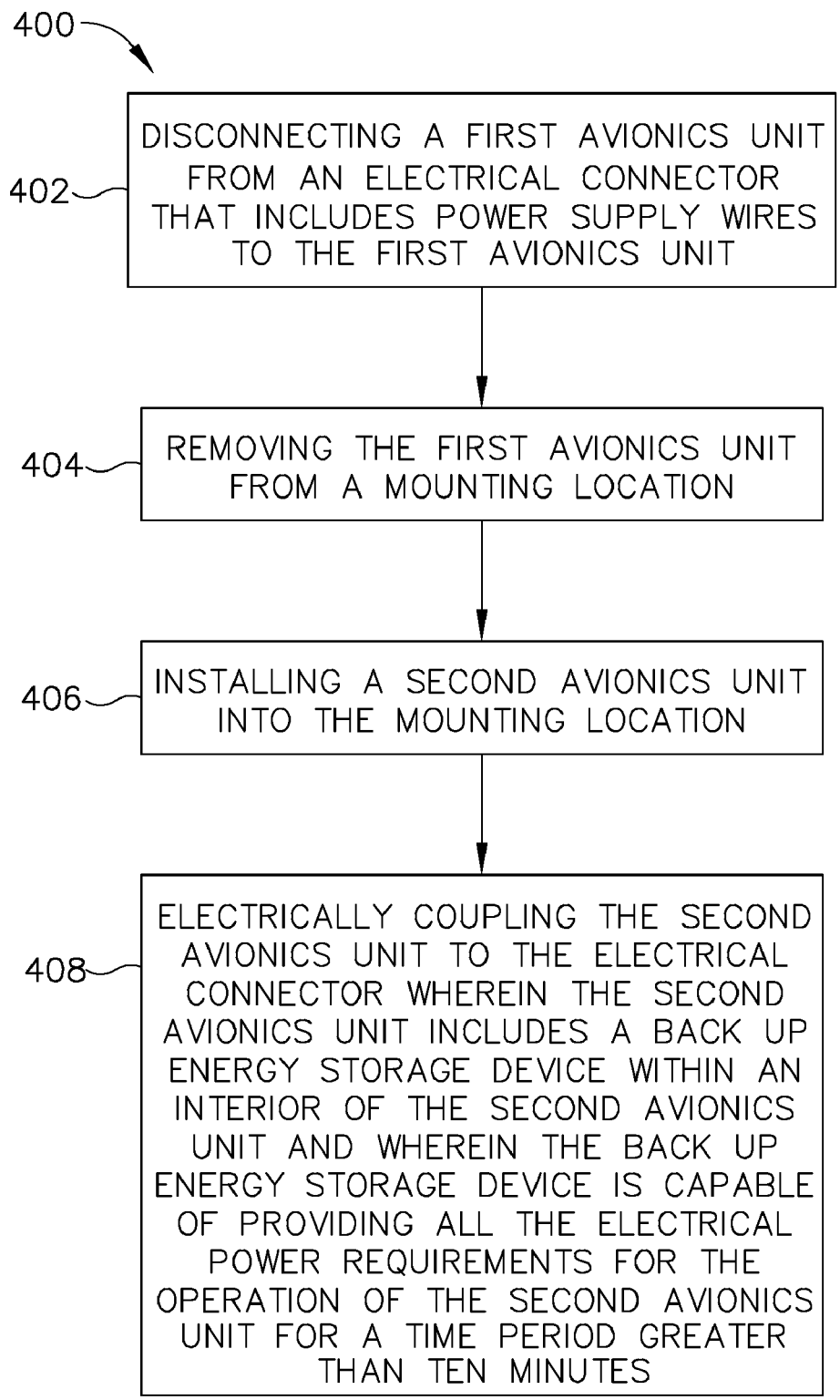

FIG. 4 is a flow diagram of a method 400 of providing a back up power supply for avionics equipment integrated into a single enclosure of an avionics unit in accordance with an exemplary embodiment of the present invention. Method 400 includes disconnecting 402 a first avionics unit from an electrical connector that includes power supply wires to the first avionics unit, removing 404 the first avionics unit from a mounting location, installing 406 a second avionics unit into the mounting location, and electrically coupling 408 the second avionics unit to the electrical connector, the second avionics unit including a back up energy storage device within an interior of the second avionics unit wherein the back up energy storage device is capable of providing all the electrical power requirements for the operation of the second avionics unit for a time period greater than ten minutes.

The term processor, as used herein, refers to central processing units, microprocessors, microcontrollers, reduced instruction set circuits (RISC), application specific integrated circuits (ASIC), logic circuits, and any other circuit or processor capable of executing the functions described herein.

As used herein, the terms "software" and "firmware" are interchangeable, and include any computer program stored in memory for execution by processor 116, including RAM memory, ROM memory, EPROM memory, EEPROM memory, and non-volatile RAM (NVRAM) memory. The above memory types are exemplary only, and are thus not limiting as to the types of memory usable for storage of a computer program.

As will be appreciated based on the foregoing specification, the above-described embodiments of the disclosure may be implemented using computer programming or engineering techniques including computer software, firmware, hardware or any combination or subset thereof, wherein the technical effect is to monitor the operation of an energy storage device and to perform controlled battery charging and discharging operations that facilitate maintaining a life of the energy storage device at an optimal level. Any such resulting program, having computer-readable code means, may be embodied or provided within one or more computer-readable media, thereby making a computer program product, i.e., an article of manufacture, according to the discussed embodiments of the disclosure. The computer readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

The above-described embodiments of a method and system of supplying backup power for an avionics unit provides a cost-effective and reliable means providing the required electrical power for the avionics unit to continue operation during all modes of operation of the aircraft especially off-normal time periods. As a result, the methods and systems described herein facilitate data collection of aircraft parameters in a cost-effective and reliable manner.

While the disclosure has been described in terms of various specific embodiments, it will be recognized that the disclosure can be practiced with modification within the spirit and scope of the claims.

What is claimed is:

1. An avionics system comprising:
   an avionics enclosure for installation within an aircraft;
   a recording device positioned within said enclosure;
   a back up energy storage device positioned within said enclosure with said recording device, said energy storage device electrically coupled to said recording device to supply electrical power to said recording device for a time period of greater than thirty seconds; and
   a charger positioned within said enclosure with said energy storage device, said charger configured to monitor the operation of the energy storage device and to perform controlled charging and discharging operations that facilitate maintaining a life of the energy storage device at an optimal level;
   wherein the avionics enclosure is plug compatible with an avionics system that does not include a back up energy storage device.

2. An avionics system in accordance with claim 1 further comprising an electrical connector extending through said enclosure, said electrical connector configured to electrically couple at least one of said recording device and said energy storage device to a source of electrical power external to said enclosure.

3. An avionics system in accordance with claim 1 wherein said recording device comprises a cockpit voice recorder.

4. An avionics system in accordance with claim 1 wherein said energy storage device is capable of supplying all electrical power requirements of said recording device for a time period of greater than ten minutes.

5. An avionics system in accordance with claim 1 wherein said energy storage device is capable of supplying all electrical power requirements of said recording device for a time period of approximately twenty minutes.

6. An avionics system in accordance with claim 1 wherein said energy storage device comprises an electrochemical storage device.

7. An avionics system in accordance with claim 1 wherein said energy storage device comprises a supercapacitor.

8. An avionics system in accordance with claim 1 wherein said energy storage device comprises a ceramic material.

9. An avionics system in accordance with claim 1 wherein said energy storage device comprises barium titanate.

10. An avionics system in accordance with claim 1 further comprising a maintenance module electrically coupled to the energy storage device, said maintenance module configured to maintain a predetermined energy storage capability within the energy storage device.

11. A method of providing an integrated back up power supply for an avionics unit, said method comprising:

providing an avionics enclosure for installation in an aircraft, the enclosure plug compatible with an avionics unit that does not include a back up energy storage device;

positioning a voice recorder within the enclosure;

positioning a back up energy storage device within the enclosure with the voice recorder, the energy storage device electrically coupled to said voice recorder, said energy storage device capable of providing all the electrical power requirements for the operation of the voice recorder for a time period greater than ten minutes; and positioning a charger within the enclosure with the energy storage device, the charger configured to monitor the operation of the energy storage device and to perform controlled charging and discharging operations that facilitate maintaining a life of the energy storage device at an optimal level.

12. A method in accordance with claim 11 wherein said providing an enclosure comprises providing a retrofit enclosure having substantially similar dimensions as an avionics unit being replaced by the avionics unit including the integrated back up power supply.

13. A method in accordance with claim 11 further comprising electrically coupling at least one of the voice recorder and the energy storage device to a power supply bus of an aircraft.

14. A method in accordance with claim 11 further comprising electrically coupling a maintenance module to the energy storage device, said maintenance module configured to maintain a predetermined energy storage capability within the energy storage device.

15. A method of providing a back up power supply for an avionics equipment integrated into a single enclosure of an avionics unit, said method comprising:

disconnecting a first avionics unit from an electrical connector that includes power supply wires to the first avionics unit;

removing the first avionics unit from a mounting location;

installing a second avionics unit into the mounting location; and electrically coupling the second avionics unit to the electrical connector, the second avionics unit comprising a back up energy storage device within an interior of the second avionics unit, the back up energy storage device capable of providing all the electrical power requirements for the operation of the second avionics unit for a time period greater than ten minutes, the second avionics unit comprising a charger within the interior with the back up energy storage device, the charger configured to monitor the operation of the back up energy storage device and to perform controlled charging and discharging operations that facilitate maintaining a life of the back up energy storage device at an optimal level.

16. A method in accordance with claim 15 wherein electrically coupling the second avionics unit to the electrical connector comprises electrically coupling a sound recorder to a primary power supply that supplies power to the voice recorder during normal operation.

17. A method in accordance with claim 16 further comprising supplying back up power to the sound recorder from a back up power supply when the primary power supply is not available.

18. A method in accordance with claim 16 further comprising supplying back up power to the sound recorder from at least one of a supercapacitor and an electrochemical energy storage device.

19. A method in accordance with claim 16 further comprising electrically coupling a maintenance module to the back up energy storage device, said maintenance module configured to maintain a predetermined energy storage capability within the energy storage device.

* * * * *